(12) United States Patent
Kong (10) Patent No.: US 10,789,415 B2
(45) Date of Patent: Sep. 29, 2020

(54) INFORMATION PROCESSING METHOD AND RELATED DEVICE

(71) Applicant: Tencent Technology (Shenzhen) Company Limited, Shenzhen, Guangdong (CN)

(72) Inventor: Hang Kong, Guangdong (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 0 days.

(21) Appl. No.: 16/542,054

(22) Filed: Aug. 15, 2019

(65) Prior Publication Data

US 2019/0370316 A1 Dec. 5, 2019

Related U.S. Application Data

(63) Continuation of application No. PCT/CN2017/089586, filed on Jun. 22, 2017.

(51) Int. Cl.
*G06F 40/126* (2020.01)
*G06N 20/10* (2019.01)
(Continued)

(52) U.S. Cl.
CPC ............ *G06F 40/126* (2020.01); *G06F 17/18* (2013.01); *G06N 3/08* (2013.01); *G06N 20/10* (2019.01);
(Continued)

(58) Field of Classification Search
CPC ....... G06F 40/126; G06F 17/18; G06N 20/10; G06N 3/08; H03M 7/3082; H03M 7/6005
(Continued)

(56) References Cited

U.S. PATENT DOCUMENTS 7,031,970 B2 4/2006 Blitzer
10,530,427 B2 * 1/2020 Moro ................. G06K 7/10316
(Continued)

FOREIGN PATENT DOCUMENTS

CN 105512687 4/2016
CN 105740226 7/2016
(Continued)

OTHER PUBLICATIONS

Wopianxiao_NSNirvana, "Talking about intelligent search and dialogue type OS", Jianshu.com <https://www.jianshu.com/p/3a9f49834c4a>, dated May 22, 2017, 3 pages.
(Continued)

*Primary Examiner* — Brian K Young
(74) *Attorney, Agent, or Firm* — Brinks Gilson & Lione (57) ABSTRACT

An information processing method includes obtaining text information and a sentence set; encoding a sentence in the sentence set using a first encoder to obtain a first encoded vector, and encoding the sentence using a second encoder to obtain a second encoded vector. The first encoded vector is determined according to the sentence, and the second encoded vector is determined according to a feature of the sentence. The method also includes determining a sentence encoded vector according to the first and second encoded vectors; encoding the sentence encoded vector using a third encoder to obtain global information; decoding the global information using a decoder; and determining a probability value corresponding to the sentence. Accordingly, when a deep learning method is used, a manually extracted sentence is further added to perform feature training, to effectively improve a learning capability of a model, thereby improving an information processing capability and effect.

20 Claims, 6 Drawing Sheets

(51) Int. Cl.
    *G06F 17/18* (2006.01)
    *G06N 3/08* (2006.01)
    *H03M 7/30* (2006.01)
(52) U.S. Cl.
    CPC ....... *H03M 7/3082* (2013.01); *H03M 7/6005* (2013.01); *H03M 7/6011* (2013.01)
(58) Field of Classification Search
    USPC ................................... 341/50, 51, 106, 107
    See application file for complete search history.

(56) References Cited

U.S. PATENT DOCUMENTS

| 10,549,182 B2* | 2/2020 | Miwa .................... A63F 13/843 |
| 10,661,166 B2* | 5/2020 | Kondo .................. A63F 13/355 |
| 2004/0117340 A1 | 6/2004 | Blitzer |

FOREIGN PATENT DOCUMENTS

| CN | 105930314 | 9/2016 |
| CN | 106407178 | 2/2017 |
| CN | 106855853 A | 6/2017 |
| WO | WO 2018-232699 | 12/2018 |

OTHER PUBLICATIONS

Office Action dated Dec. 30, 2019 for Chinese Application No. 201780054183.7 with concise English Translation, 8 pages.
International Search Report in in PCT/CN2017/089586 dated Dec. 20, 2017 (2 pages in English, 2 pages in Chinese).
Chinese International Search Report and Written Opinion in PCT/CN2017/089586 dated Dec. 20, 2017 (10 pages).

* cited by examiner

INFORMATION PROCESSING METHOD AND RELATED DEVICE

RELATED APPLICATION

This application is a continuation of PCT application Number PCT/CN2017/089586, entitled "INFORMATION PROCESSING METHOD AND RELATED DEVICE," filed Jun. 22, 2017, which is incorporated by reference in its entirety.

FIELD OF THE TECHNOLOGY

The present disclosure relates to the field of Internet technologies, and in particular, to an information processing method and a related apparatus.

BACKGROUND OF THE DISCLOSURE

Currently, Internet information is explosively increased, and people inevitably face a problem of information overload. How to process massive redundant information and save users' reading time has become a problem in the Internet era.

At present, a manner of processing the massive redundant information is to obtain an automatic abstract based on statistics, which mainly includes the following steps: first obtaining an original text; then performing term frequency statistics on a "keyword" in the original text information; calculating sentence weights according to information such as term frequency of the sentences; and performing sorting in descending order according to values of the weights, where several sentences having highest weights are determined as abstract sentences.

However, in an actual case, because composition structures and composition manners of sentences are diversified in different files, if sentences are extracted as an abstract from a file through statistics, accuracy of abstract content is low although a relatively complete abstract can be obtained. Some sentences or word groups are not abstract, resulting in poor information processing.

SUMMARY

Embodiments of the present disclosure provide an information processing method and a related apparatus, to add a manually extracted sentence for encoding when a first encoded vector is obtained by using a deep learning method, to obtain a second encoded vector. A training model is generated with reference to information about the first encoded vector and the second encoded vector, to effectively improve a learning capability of a preconfigured training model, thereby improving an information processing capability and effect.

A first aspect of the embodiments provides an information processing method, including:

obtaining to-be-processed text information and a sentence set;

encoding a sentence in the sentence set by using a first encoder, to obtain a first encoded vector, and encoding the sentence in the sentence set by using a second encoder, to obtain a second encoded vector, the first encoded vector being determined according to the sentence, and the second encoded vector being determined according to a feature of the sentence;

determining a sentence encoded vector according to the first encoded vector and the second encoded vector;

encoding the sentence encoded vector by using a third encoder, to obtain global information; and decoding the global information by using a decoder, and determining a probability value corresponding to each sentence in the to-be-processed text information, the probability value being used for determining abstract file information.

A second aspect of the embodiments provides an information processing apparatus, including a memory, a processor, and a bus system, the memory being configured to store a program;

the processor being configured to execute the program in the memory, to perform the following steps:

obtaining to-be-processed text information and a sentence set;

encoding a sentence in the sentence set by using a first encoder, to obtain a first encoded vector; and encoding the sentence in the sentence set by using a second encoder, to obtain a second encoded vector, the first encoded vector being determined according to the sentence, and the second encoded vector being determined according to a feature of the sentence;

determining a sentence encoded vector according to the first encoded vector and the second encoded vector;

encoding the sentence encoded vector by using a third encoder, to obtain global information; and decoding the global information by using a decoder, and determining a probability value corresponding to each sentence in the to-be-processed text information, the probability value being used for determining abstract file information; and the bus system being configured to connect the memory and the processor, so that the memory can communicate with the processor.

A third aspect of the present disclosure provides a computer-readable storage medium, the computer-readable storage medium storing instructions, and the instructions, when run on a computer, causing the computer to perform the method according to the foregoing aspects.

In the technical solutions provided in the embodiments of the present disclosure, an information processing method is provided, and mainly includes: first obtaining, by an information processing apparatus, to-be-processed text information and a sentence set; and then encoding, by the information processing apparatus, a sentence in the sentence set by using a first encoder, to obtain a first encoded vector, and encoding the sentence in the sentence set by using a second encoder, to obtain a second encoded vector, the first encoded vector being determined according to the sentence, and the second encoded vector being determined according to a feature of the sentence; further, first determining, by the information processing apparatus, a sentence encoded vector according to the first encoded vector and the second encoded vector, and encoding the sentence encoded vector by using a third encoder, to obtain global information; and at last, decoding, by the information processing apparatus, the global information by using a decoder, and obtaining, according to a decoding result, a probability value corresponding to each sentence in the to-be-processed text information, the probability value being used for determining abstract file information. According to the foregoing manner, when the first encoded vector is obtained by using a deep learning method, a manually extracted sentence is further added for encoding to obtain the second encoded vector. A training model is generated with reference to information about the first encoded vector and the second encoded vector, to effectively improve a learning capability of a preconfigured training model, thereby improving an information processing capability and effect.

DETAILED DESCRIPTION

The following describes the technical solutions in the embodiments of the present disclosure with reference to the accompanying drawings in the embodiments. Of course, the described embodiments are only some embodiments instead of all embodiments of the present disclosure.

Terms such as "first", "second", "third", and "fourth" (if the terms exist) in this specification, claims, and accompanying drawings of the present disclosure are used for distinguishing between similar objects instead of describing a particular sequence or order. It should be understood that data termed in such a way are interchangeable in appropriate circumstances, so that the embodiments described herein can be implemented in an order other than an order illustrated or described herein. In addition, terms "include", "possess", and any variant thereof are intended to cover non-exclusive inclusion. For example, a process, method, system, product, or device that includes a list of steps or units does not need to be limited to the listed steps or units, but may include other steps or units not clearly listed, or may include other steps or units inherent to the process, method, product, or device.

Figure 1:
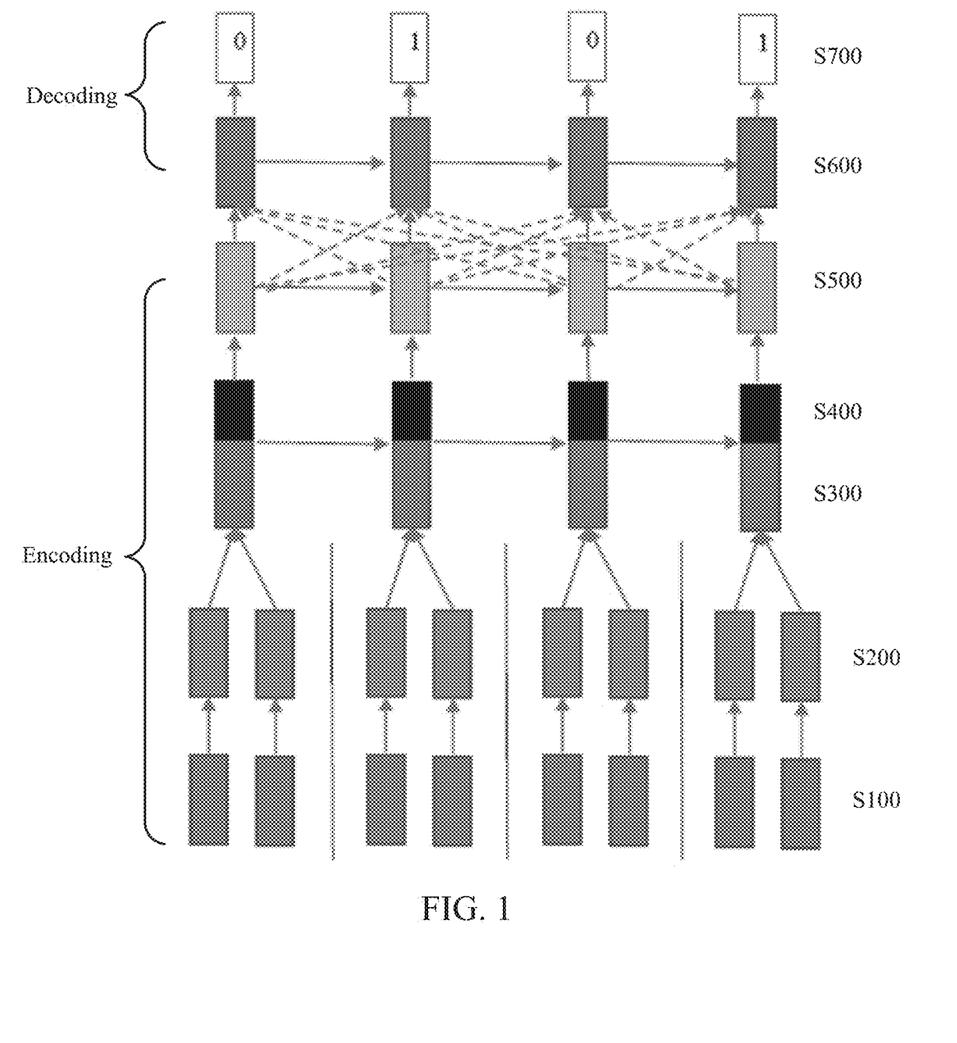
FIG. 1 is a schematic architectural diagram of an information processing method according to an embodiment.

It should be understood that, the embodiments of the present disclosure may be applied to model training. FIG. 1 is a schematic architectural diagram of an information processing method according to various embodiments. As shown in the figure, the solution includes an encoding process and a decoding process. The encoding is implemented by an encoder, and the decoding is implemented by a decoder. A file needs to be read in the encoding process to extract and train first feature sample information and second feature sample information. In the decoding process, to-be-processed text information needs to be processed by using a trained model, and a probability value of each sentence needs to be obtained. In FIG. 1, a sentence whose probability value is "0" is not used as a component of abstract content, and a sentence whose probability value is "1" is used as a candidate component of the abstract content.

An information processing architecture in FIG. 1 has a plurality of layers. Layer S100 indicates each sentence extracted from a sentence set, and layer S200 indicates a word in each extracted sentence. Layer S300 indicates encoding the word in each sentence by using a first encoder to obtain a first encoded vector. Similarly, layer S400 indicates encoding the word in each sentence by using a second encoder to obtain a second encoded vector. On layer S500, a sentence encoded vector is encoded by using a third encoder. The sentence encoded vector is obtained by concatenating the first encoded vector and the second encoded vector.

The layers S100 to S500 all belong to the encoding process, and the decoding process is described below.

On layer S600, global information obtained through encoding is further decoded by using the decoder. At last, the probability value corresponding to each sentence in the decoded to-be-processed text information is obtained on layer S700.

Figure 2:
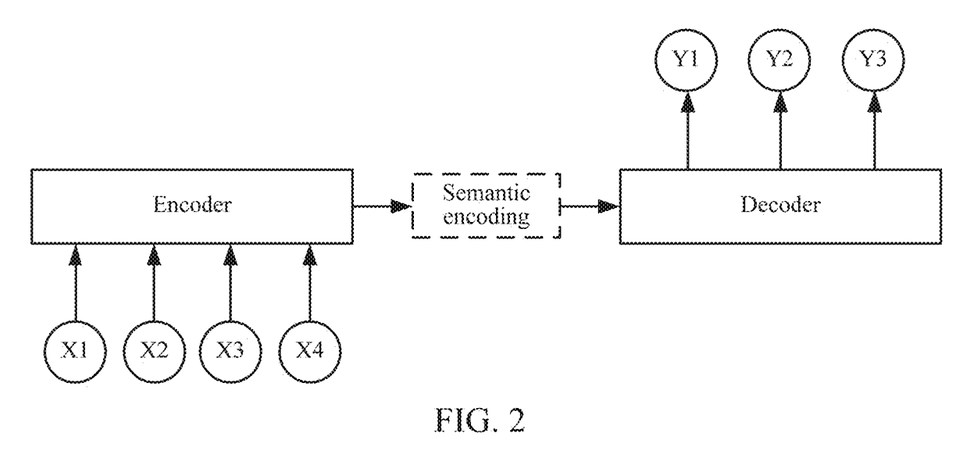
FIG. 2 is a schematic architectural diagram of an encoder and a decoder according to an embodiment.

It should be understood that, an encoder-decoder composition framework used in the solution is shown in FIG. 2. FIG. 2 is a schematic architectural diagram of an encoder and a decoder according to various embodiments. An encoder-decoder framework may be considered as a research mode in a text processing field and has a wide application scenario. For example, the encoder-decoder framework may be considered as a general processing model suitable for generating one sentence (for example, an article) from another sentence (for example, an article). For a sentence pair <X, Y>, an objective is generating a target sentence Y by using the encoder-decoder framework when an input sentence X is provided. X and Y may be in the same language or may be in two different languages. X and Y are respectively formed by respective word sequences:

$$X=(x_1, x_2, \ldots, x_\alpha)$$

$$Y=(y_1, y_2, \ldots, y_\beta)$$

As the name implies, the encoder encodes the input sentence X, and converts, through nonlinear conversion, the input sentence into intermediate semantics represented by C:

$$C=\Im(x_1, x_2, \ldots, x_\alpha)$$

For the decoder, a task of the decoder is generating, according to the intermediate semantics of the sentence X and historical information $y_1, y_2, \ldots, y_{i-1}$ that has been generated before, a word $y_i$ to be generated at a time point i:

$$y_i=\eta(C, y_1, y_2, \ldots, y_{i-1})$$

Each $y_i$ is sequentially generated in this manner. Therefore, it seems that an entire system generates the target sentence Y according to the input sentence X.

The encoder and the decoder are a very general computing framework. Specific models used by the encoder and the decoder may be determined by a researcher. Common models include, but are not limited to, a convolutional neural network (CNN) and a recurrent neural network (RNN).

Figure 3:
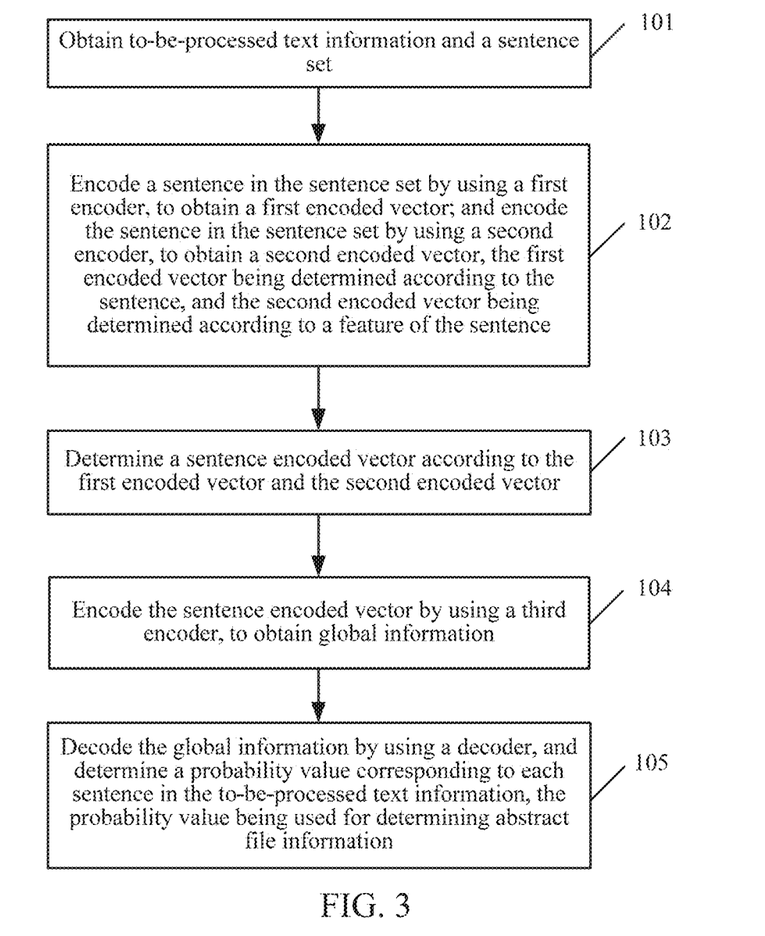
FIG. 3 is a schematic diagram of an embodiment of an information processing method according to an embodiment.

The information processing method in the present disclosure is described low. Referring to FIG. 3, an embodiment of the information processing method includes the following steps:

101. Obtain to-be-processed text information and a sentence set.

In this embodiment, an information processing apparatus first obtains the to-be-processed text information. The to-be-processed text information is a text from which abstract content needs to be extracted, and may be usually an article, a paragraph, or the like. A language type of the to-be-processed text information is not limited herein, and the to-be-processed text information may be Chinese text information, English text information, German text information, Japanese text information, or the like.

102. Encode a sentence in the sentence set by using a first encoder, to obtain a first encoded vector; and encode the sentence in the sentence set by using a second encoder, to obtain a second encoded vector, the first encoded vector being determined according to the sentence, and the second encoded vector being determined according to a feature of the sentence.

In this embodiment, the information processing apparatus encodes each sentence in the sentence set by using different encoders. The sentence set includes at least one sentence.

The first encoder and the second encoder need to be both used in an encoding process. The first encoder performs determining according to each sentence in the sentence set, and the second encoder performs determining according to the sentence feature of each sentence in the sentence set. The sentence set includes a plurality of sentences, and the sentence set may be specifically an article, a paragraph, or the like.

It may be understood that, both the first encoded vector and the second encoded vector are represented in a vector form.

103. Determine a sentence encoded vector according to the first encoded vector and the second encoded vector.

In this embodiment, after obtaining the first encoded vector and the second encoded vector that correspond to each sentence, the information processing apparatus further needs to determine the sentence encoded vector corresponding to each sentence. It may be understood that, the sentence encoded vector is also represented in the vector form.

104. Encode the sentence encoded vector by using a third encoder, to obtain global information.

In this embodiment, the information processing apparatus further encodes, by using the third encoder, the sentence encoded vector corresponding to each sentence, and then obtains the global information of the entire sentence set.

105. Decode the global information by using a decoder, and determine a probability value corresponding to each sentence in the to-be-processed text information, the probability value being used for determining abstract file information.

In this embodiment, after decoding the global information by using the decoder, the information processing apparatus may obtain a decoding result; then obtains, by using the decoding result, the probability value corresponding to each sentence in the to-be-processed text information; and finally selects, as a target sentence, a sentence whose probability value is greater than a preset threshold, and generates the abstract file information according to the target sentence. For example, the decoder sequentially decodes a result of the encoder and a result output at a previous time point, to generate a probability value 0 or 1. 1 represents that the sentence is selected as a component of the abstract file information, and 0 is on the contrary.

In the technical solution provided in this embodiment, an information processing method is provided, and mainly includes: first obtaining, by an information processing apparatus, to-be-processed text information and a sentence set; and then encoding, by the information processing apparatus, a sentence in the sentence set by using a first encoder, to obtain a first encoded vector, and encoding the sentence in the sentence set by using a second encoder, to obtain a second encoded vector, the first encoded vector being determined according to the sentence, and the second encoded vector being determined according to a feature of the sentence; further, first determining, by the information processing apparatus, a sentence encoded vector according to the first encoded vector and the second encoded vector, and encoding the sentence encoded vector by using a third encoder, to obtain global information; and at last, decoding, by the information processing apparatus, the global information by using a decoder, and obtaining, according to a decoding result, a probability value corresponding to each sentence in the to-be-processed text information, the probability value being used for determining abstract file information. According to the foregoing manner, when the first encoded vector is obtained by using a deep learning method, a manually extracted sentence is further added for encoding to obtain the second encoded vector. A training model is generated with reference to information about the first encoded vector and the second encoded vector, to effectively improve a learning capability of a preconfigured training model, thereby improving an information processing capability and effect.

Optionally, based on the embodiment corresponding to FIG. 3, in a first optional embodiment of the information processing method, the encoding a sentence in the sentence set by using a first encoder, to obtain a first encoded vector may include:

encoding each sentence in the sentence set by using a preset neural network algorithm; and obtaining the first encoded vector according to an encoding result of each sentence in the sentence set.

In this embodiment, a manner of obtaining the first encoded vector is described. To be specific, each sentence in the sentence set is encoded by using the preset neural network algorithm, and then the first encoded vector is obtained.

Specifically, the preset neural network algorithm herein may be a CNN algorithm, an RNN algorithm, or a deep neural network (DNN) algorithm. In terms of a DNN structure only, there is no difference between a fully-connected DNN and a multilayer perceptron. It should be noted that, a problem of gradient diffusion is further avoided through a highway network and deep residual learning. A quantity of network layers can reach more than 100. A quantity of parameters is limited and a local structure is mined by using a CNN model. A CNN can still be applied to text recognition by using local information in a speech spectral structure. In a common fully-connected network or the CNN, a signal of a neuron on each layer can be transmitted only to an upper layer, and sample processing is independent at each time point. Therefore, the common fully-connected network or the CNN is also referred to as a forward neural network. A RNN may be considered as a neural network performing transferring in terms of time.

It may be understood that, regardless of which neural network, the neural networks are usually mixed for use in an actual application. For example, a fully-connected layer is usually added to the CNN and the RNN before upper-layer output. In an actual application, a more flexible combination manner may exist, and more network structures will be developed. The CNN, the RNN, and the DNN that are listed herein are merely examples, and should not be understood as a limitation on the present disclosure.

Figure 4:
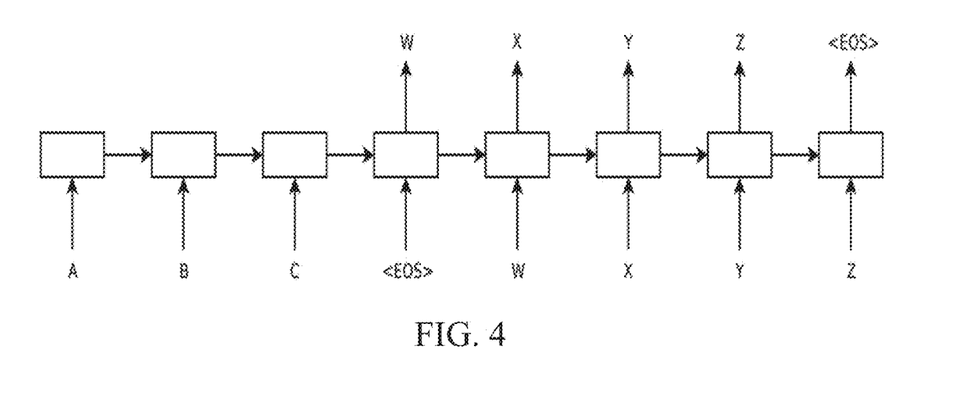
FIG. 4 is a schematic diagram of a framework of an RNN model according to an embodiment.

FIG. 4 is a schematic diagram of a framework of an RNN model according to various embodiments. As shown in the figure, the RNN model includes an encoder and a decoder. An RNN in the encoder sequentially processes input sequences "ABC", and an implicit status of the RNN may indicate some input sequences having been processed at a current time point. After the encoder completes processing the input sequences, the implicit status of the RNN may desirably indicate all information about the input sequences. The decoder sequentially decodes an encoding result of the encoder and an output of a previous time point to generate sequences "WXYZ".

For ease of understanding, using the RNN algorithm as an example, a first encoded vector corresponding to an $i^{th}$ sentence may be calculated in the following manner:

$$SR_i = RNN(w_{i1}, w_{i2}, \ldots, w_{in})$$

$SR_i$ represents the first encoded vector corresponding to the $i^{th}$ sentence in the sentence set, RNN( ) indicates that the RNN is used for processing, $(w_{i1}, w_{i2}, \ldots, w_{in})$ represents a word set of the $i^{th}$ sentence in the sentence set, $w_{i1}$ represents the first word in the $i^{th}$ sentence, and $w_{in}$ represents an $n^{th}$ word in the $i^{th}$ sentence.

In this embodiment, the manner of determining the first encoded vector is described. To be specific, the information processing apparatus first encodes each sentence in the sentence set by using the preset neural network algorithm, and then obtains the first encoded vector according to the encoding result of each sentence in the sentence set. According to the foregoing manner, indication of sample sentences can be enriched by using the vector form, to improve a learning capability of a training model, thereby improving accuracy when the abstract file information is output. In addition, operability and feasibility of the solution can be improved, facilitating actual operation.

Optionally, based on FIG. 3 or the first embodiment corresponding to FIG. 3, in a second optional embodiment of the information processing method, the encoding the sentence in the sentence set by using a second encoder, to obtain a second encoded vector may include:

obtaining preset sentence feature information of each sentence in the sentence set, where the preset sentence feature information includes at least one of sentence length information, sentence-title coincidence degree information, and sentence location information;

encoding each sentence according to the preset sentence feature information; and obtaining the second encoded vector according to an encoding result of each sentence in the sentence set.

In this embodiment, a manner of obtaining the second encoded vector is described. To be specific, the preset sentence feature information of each sentence in the sentence set is first obtained, then each sentence is encoded according to the preset sentence feature information, and at last, the second encoded vector is obtained according to the encoding result of each sentence in the sentence set.

Specifically, manual feature extraction is performed on each sentence in the sentence set according to a feature engineering mode. The extracted preset sentence feature information includes, but is not limited to, at least one of the sentence length information, the sentence-title coincidence degree information, and the sentence location information. The sentence length information may be indicated by using a quantity of characters. For example, "I am a good student" includes 19 characters (in Chinese), and the sentence length information is 19. The sentence-title coincidence degree information may refer to a quantity of words in a sentence that are coincident with those in a title. The sentence location information may be a specific location of a sentence in the sentence set. For example, the second character to the $29^{th}$ character in the third row may be defined as "3229". It should be noted that, in an actual application, manners of extracting and processing the preset sentence feature information are not limited.

In a process of obtaining the second encoded vector, the information processing apparatus may use the following formula for calculation:

$$SF_i = \text{feature}(w_{i1}, w_{i2}, \ldots, w_{in})$$

First, the sentence set is obtained, and then the $i^{th}$ sentence in the sentence set is selected for processing. One sentence usually includes a plurality of words, and each word is numbered according to an occurrence sequence. For example, the first word is represented by $w_{i1}$, the second word is represented by $w_{i2}$, and an $n^{th}$ word is represented by $w_{in}$. Then, the single sentence is processed in a conventional feature manner, to finally obtain second feature sample information of the $i^{th}$ sentence. The second feature sample information may be expressed as $SF_i$ in the vector form.

In this embodiment, the manner of determining the second encoded vector is described. To be specific, the information processing apparatus first obtains the preset sentence feature information of each sentence in the sentence set, where the preset sentence feature information includes at least one of the sentence length information, the sentence-title coincidence degree information, and the sentence location information; then encodes each sentence according to the preset sentence feature information; and at last, obtains the second encoded vector according to the encoding result of each sentence in the sentence set. According to the foregoing manner, the indication of the sample sentences can be enriched by using the vector form, to improve the learning capability of the training model, thereby improving the accuracy when the abstract file information is output. In addition, the operability and the feasibility of the solution can be improved, facilitating the actual operation.

Optionally, based on FIG. 3 or the first or the second embodiment corresponding to FIG. 3, in a third optional embodiment of the information processing method, determining the global information according to the first encoded vector and the second encoded vector may include:

concatenating the first encoded vector and the second encoded vector into the global information by using a connection function concat.

In this embodiment, after obtaining the first encoded vector and the second encoded vector, the information processing apparatus may further calculate the global information in the following manner:

$$S_i = \text{concat}(SR_i, SF_i)$$

$S_i$ represents global information of the $i^{th}$ sentence, $SR_i$ represents the first encoded vector, $SF_i$ represents the second encoded vector, and concat( ) indicates concatenating the first encoded vector and the second encoded vector.

In other words, each sentence in the sample sentences is obtained by concatenating the first encoded vector and the second encoded vector.

In an actual application, there are a plurality of manners, for example, a logical representation method, a connection method, or a semantic space method, of concatenating the first encoded vector and the second encoded vector into the global information. The logical representation method is a syntax analysis method. In such a method, it is considered that there is a close correspondence between syntax representation and a semantic structure. A word is considered as a basic composition symbol of a language, a function between these symbols is defined, and a meaning of a phrase or a sentence is expressed as a true-value condition of a logical sentence formed by these symbols.

In the connection method, limited symbols are connected to form more, even infinite, structures to enhance an expression capability of the method. A key means of achieving this objective is binding. A basic step of the binding is concatenating the symbols according to a certain syntax process, and the process is reversible. When these symbols are represented by vectors, a tensor product of two vectors u and v is a matrix, and an element u_a×v_b of the matrix is obtained through cross multiplication of elements in u and v.

In semantic space, compared with combining word vectors to generate a phrase vector, more work focuses on directly generating a phrase vector. If occurrence frequency of a phrase is high enough, the phrase may be considered as an independent unit, and as described above, a corresponding vector is generated according to co-occurrence frequency. A drawback of this method is that when a phrase is very long, it is difficult to apply the method. This is because a longer phrase length indicates sparser data. Vector addition or averaging is one common, or the most common, vector combination manner.

Further, in this embodiment, a manner of determining the global information according to the first encoded vector and the second encoded vector is described. To be specific, the global information can be obtained by concatenating the first encoded vector and the second encoded vector. According to the foregoing manner, global information that is more abundant and that includes more features can be obtained. Encoding using this global information helps to improve diversity and accuracy of training, thereby obtaining a more proper training model.

Optionally, based on FIG. 3 or any one of the first to the third embodiments corresponding to FIG. 3, in a fourth optional embodiment of the information processing method, encoding the global information by using the third encoder, to obtain a global encoded vector may include:

encoding the global information by using the preset neural network algorithm; and obtaining the global encoded vector according to an encoding result of the global information.

In this embodiment, after obtaining the global information, the information processing apparatus needs to encode the global information by further using the preset neural network algorithm, and at last obtains the global encoded vector according to the encoding result of the global information.

Specifically, the information processing apparatus calculates, in the following manner, the global encoded vector corresponding to the to-be-processed text information:

$$h_i = RNN(h_{i-1}, S_i)$$

$h_i$ represents a global encoded vector corresponding to the $i^{th}$ sentence in the to-be-processed text information, $h_{i-1}$ represents a global encoded vector corresponding to an $(i-1)^{th}$ sentence in the to-be-processed text information, $S_i$ represents the global information corresponding to the $i^{th}$ sentence, and RNN( ) indicates using the RNN for processing.

A global encoded vector corresponding to each sentence is sequentially calculated in the to-be-processed text information, to obtain the global encoded vector of the entire to-be-processed text information. For example, if there are ten sentences in total in the to-be-processed text information, and a global encoded vector corresponding to the first sentence is:

$$h_1 = RNN(S_1)$$

A global encoded vector corresponding to the second sentence is:

$$h_2 = RNN(h_1, S_2)$$

By analogy, a global encoded vector corresponding to the tenth sentence is:

$$h_{10} = RNN(h_9, S_{10})$$

In this way, the global encoded vector of the to-be-processed text information is obtained.

It may be understood that, in an actual application, the preset neural network algorithm may be the CNN algorithm, the RNN algorithm, or the DNN algorithm. Using the RNN algorithm for calculation herein is merely an example, and should not be understood as a limitation on the present disclosure.

Further, in this embodiment, a manner of obtaining the global encoded vector corresponding to the to-be-processed text information is described. To be specific, the global information may be first encoded by using the preset neural network algorithm, and then the global encoded vector may be obtained according to the encoding result of the global information. According to the foregoing manner, the operability and the feasibility of the solution can be improved, facilitating the actual operation.

Optionally, based on FIG. 3 or any one of the first to the fourth embodiments corresponding to FIG. 3, in a fifth optional embodiment of the information processing method, decoding the global encoded vector by using the decoder, to obtain the probability value corresponding to each sentence in the to-be-processed text information may include:

decoding the global encoded vector by using the decoder, to obtain decoded information corresponding to each sentence;

normalizing the global encoded vector, to obtain a normalized value; and determining, according to the normalized value and the decoded information corresponding to each sentence, the probability value corresponding to each sentence in the to-be-processed text information.

In this embodiment, when the probability value corresponding to each sentence in the to-be-processed text information is calculated, the global encoded vector needs to be first decoded by using the decoder, to obtain the decoded information corresponding to each sentence. Then, the global encoded vector is normalized to obtain the normalized value. At last, the probability value corresponding to each sentence in the to-be-processed text information is determined according to the normalized value and the decoded information corresponding to each sentence.

For ease of understanding, how to calculate a probability value corresponding to a sentence is described below by using a group of specific calculation formulas.

First, attention of the $i^{th}$ sentence to a $j^{th}$ sentence in the to-be-processed text information before the normalization is first calculated by using a formula $e_{ij} = a\ (h'_{i-1}, h_j)$. The $i^{th}$ sentence and the $j^{th}$ sentence are obtained, and then, global information corresponding to the $(i-1)^{th}$ sentence and local information $h_j$ corresponding to the $j^{th}$ sentence in the decoded to-be-processed text information are processed by using a feedforward neural network, to obtain $e_{ij}$.

The feedforward neural network is of a unidirectional multi-layer structure. Each layer includes several neurons, there is no mutual connection between neurons on a same layer, and inter-layer information is transmitted only in one direction. The first layer is referred to as an input layer. The last layer is an output layer. An intermediate layer is referred to as a hidden layer. The hidden layer may be one layer, or may be a plurality of layers.

After $e_{ij}$ is obtained, the attention of the $i^{th}$ sentence to the $j^{th}$ sentence needs to be calculated by using the following formula:

$$a_{ij} = \frac{\exp(e_{ij})}{\sum_{j=1}^{T} \exp(e_{ij})}$$

A sum of $e_{ij}$ exponents of sentences from j=1 to j=T is calculated, to obtain the attention of the $i^{th}$ sentence to the $j^{th}$ sentence.

After $a_{ij}$ is obtained, global information corresponding to the normalized $i^{th}$ sentence in the to-be-processed text information is calculated by using the following formula:

$$c_i = \Sigma_{j=1}^{T} a_{ij} h_j$$

Next, global information of the $i^{th}$ sentence in the decoded to-be-processed text information is further calculated by using the RNN algorithm and the global information corresponding to the normalized $i^{th}$ sentence. Namely, the following formula is used:

$$h'_i = RNN(c_i, p_{i-1}, h'_{i-1})$$

The global information corresponding to the normalized $i^{th}$ sentence is $c_i$, a probability value corresponding to the $(i-1)^{th}$ sentence in the to-be-processed text information is $p_{i-1}$, global information corresponding to the $(i-1)^{th}$ sentence in the decoded to-be-processed text information is $h'_{i-1}$, and $h'_i$ may be calculated by using the RNN algorithm.

A probability value of the $i^{th}$ sentence in the to-be-processed text information D may be calculated by using $h'_i$, namely, the following formula is used for calculation:

$$p(y_i=1|D) = \sigma(c_i, p_{i-1}, h'_i)$$

$p(y_i=1|D)$ represents the probability value of the $i^{th}$ sentence in the to-be-processed text information D, and $\sigma( )$ indicates using an activation function for calculation.

Further, in this embodiment, a manner of decoding the global encoded vector by using the decoder to obtain the probability value corresponding to each sentence in the to-be-processed text information is described. According to the foregoing manner, practicability and the operability of the solution can be improved.

Optionally, based on FIG. 3 or any one of the first to the fifth embodiments corresponding to FIG. 3, in a sixth optional embodiment of the information processing method, after the decoding the global encoded vector by using the decoder, to obtain the probability value corresponding to each sentence in the to-be-processed text information, the method may further include:

determining whether the probability value corresponding to each sentence is greater than a preset threshold;

if a probability value corresponding to a sentence is greater than the preset threshold, using the sentence whose probability value is greater than the preset threshold as a target sentence; and determining the abstract file information according to the target sentence; or sorting the probability value corresponding to each sentence;

using top k sentences in a sorting result as target sentences; and determining the abstract file information according to the target sentences.

In this embodiment, a manner of determining the abstract file information is described. To be specific, the probability value corresponding to each sentence in the to-be-processed text information is first obtained; then it is respectively determined whether the probability value corresponding to each sentence is greater than the preset threshold; if the probability value is greater than the preset threshold, the sentence is used as the target sentence; and at last, all the target sentences are integrated into the required abstract file information.

For ease of understanding, descriptions are provided below with reference to two specific scenarios.

Manner 1: The target sentences are selected according to the probability values, and there are k target sentences.

Table 1 shows examples of the probability value corresponding to each sentence in the to-be-processed text information.

TABLE 1

| Sequence number of a sentence | Probability value of the sentence |
|---|---|
| 1 | 0.2 |
| 2 | 0.6 |
| 3 | 0.5 |
| 4 | 0.3 |
| 5 | 0.3 |
| 6 | 0.7 |
| 7 | 0.8 |
| 8 | 0.5 |
| 9 | 0.9 |
| 10 | 0.1 |

The probability value of each sentence may be learned according to content in Table 1. Assuming that three sentences are preferentially selected as target sentences, namely, k is equal to 3, the sentences are sorted in descending order of the probability values, and a sentence 9, a sentence 7, and a sentence 6 may be obtained as the target sentences.

Manner 2: The target sentences are selected according to the probability values and the preset threshold.

Table 2 shows examples of the probability value corresponding to each sentence in the to-be-processed text information.

TABLE 2

| Sequence number of a sentence | Probability value of the sentence |
|---|---|
| 1 | 0.2 |
| 2 | 0.6 |
| 3 | 0.5 |
| 4 | 0.3 |
| 5 | 0.3 |
| 6 | 0.7 |
| 7 | 0.8 |
| 8 | 0.5 |
| 9 | 0.9 |
| 10 | 0.1 |

It may be learned according to content in Table 2 that, assuming that sentences whose probability values are greater than 0.5 are used as target sentences, four sentences whose sequence numbers are 2, 6, 7, and 9 may be determined as the target sentences.

Further, in this embodiment, the manner of determining the abstract file information is described. To be specific, it is first determined whether the probability value corresponding to each sentence in the to-be-processed text information is greater than the preset threshold, then the sentences whose probability values are greater than the preset threshold is used as the target sentences, and at last, the target sentences are integrated into the required abstract file information. According to the foregoing manner, the target sentences may be determined according to the probability values. To be specific, the target sentence is a sentence whose occurrence probability is relatively high in the to-be-processed text information. Therefore, an integrated sentence set is closer to an actual case, thereby improving accuracy of abstract content.

Figure 5:
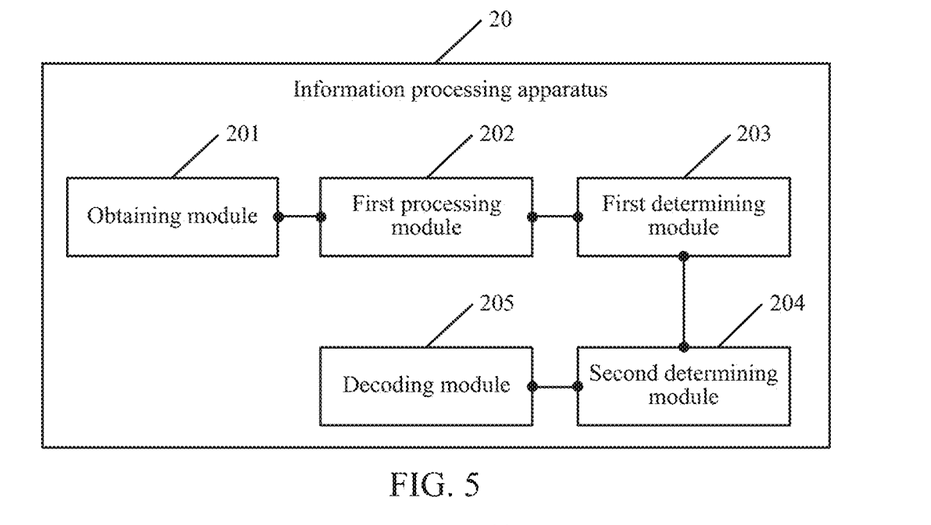
FIG. 5 is a schematic diagram of an embodiment of an information processing apparatus according to an embodiment.

The information processing apparatus in the present disclosure is described in detail below. Referring to FIG. 5, an information processing apparatus 20 according to various embodiments includes:

an obtaining module 201, configured to obtain to-be-processed text information and a sentence set;

a first processing module 202, configured to: encode, by using a first encoder, a sentence in the sentence set obtained by the obtaining module 201, to obtain a first encoded vector; and encode, by using a second encoder, the sentence in the sentence set obtained by the obtaining module 201, to obtain a second encoded vector, the first encoded vector being determined according to the sentence, and the second encoded vector being determined according to a feature of the sentence;

a determining module 203, configured to determine a sentence encoded vector according to the first encoded vector and the second encoded vector that are obtained by the first processing module 202 through processing;

a second processing module 204, configured to encode, by using a third encoder, the sentence encoded vector determined by the determining module 203, to obtain global information; and a decoding module 205, configured to decode the global information by using a decoder, to determine a probability value corresponding to each sentence in the to-be-processed text information, the probability value being used for determining abstract file information.

In this embodiment, the obtaining module 201 obtains the to-be-processed text information and the sentence set. The first processing module 202 is configured to encode, by using the first encoder, the sentence in the sentence set obtained by the obtaining module 201, to obtain the first encoded vector, and encode, by using the second encoder, the sentence in the sentence set obtained by the obtaining module 201, to obtain the second encoded vector. The first encoded vector is determined according to the sentence, and the second encoded vector is determined according to the feature of the sentence. The determining module 203 determines the sentence encoded vector according to the first encoded vector and the second encoded vector that are obtained by the first processing module 202 through processing. The second processing module 204 encodes, by using the third encoder, the sentence encoded vector determined by the determining module 203, to obtain the global information. The decoding module 205 decodes, by using the decoder, the global information obtained by the second processing module 204 through processing, to determine the probability value of each sentence in the to-be-processed text information. The probability value is used for determining the abstract file information.

In the technical solutions provided in this embodiment, an information processing apparatus is provided. The apparatus first obtains to-be-processed text information and a sentence set; then the information processing apparatus first encodes a sentence in the sentence set by using a first encoder, to obtain a first encoded vector, and encodes the sentence in the sentence set by using a second encoder, to obtain a second encoded vector, the first encoded vector being determined according to the sentence, and the second encoded vector being determined according to a feature of the sentence. Further, the information processing apparatus first determines a sentence encoded vector according to the first encoded vector and the second encoded vector; and encodes the sentence encoded vector by using a third encoder, to obtain global information. At last, the information processing apparatus first decodes the global information by using a decoder, and obtains, according to a decoding result, a probability value corresponding to each sentence in the to-be-processed text information, the probability values being used for determining abstract file information. According to the foregoing manner, when the first encoded vector is obtained by using a deep learning method, a manually extracted sentence is further added for encoding to obtain the second encoded vector. A training model is generated with reference to information about the first encoded vector and the second encoded vector, to effectively improve a learning capability of a preconfigured training model, thereby improving an information processing capability and effect.

Optionally, based on the embodiment corresponding to FIG. 5, in another embodiment of the information processing apparatus 20, the first processing module 202 is specifically configured to: encode each sentence in the sentence set by using a preset neural network algorithm; and obtain the first encoded vector according to an encoding result of each sentence in the sentence set.

In this embodiment, a manner of determining the first encoded vector is described. To be specific, the information processing apparatus first encodes each sentence in the sentence set by using the preset neural network algorithm, and then obtains the first encoded vector according to the encoding result of each sentence in the sentence set. According to the foregoing manner, indication of sample sentences can be enriched by using a vector form, to improve a learning capability of a training model, thereby improving accuracy when the abstract file information is output. In addition, operability and feasibility of the solution can be improved, facilitating actual operation.

Optionally, based on the embodiment corresponding to FIG. 5, in another embodiment of the information processing apparatus 20, the first processing module 202 is specifically configured to: obtain preset sentence feature information of each sentence in the sentence set, where the preset sentence feature information includes at least one of sentence length information, sentence-title coincidence degree information, and sentence location information;

encode each sentence according to the preset sentence feature information; and obtain the second encoded vector according to an encoding result of each sentence in the sentence set.

In this embodiment, the manner of determining the second encoded vector is described. To be specific, the information processing apparatus first obtains the preset sentence feature information of each sentence in the sentence set, where the preset sentence feature information includes at least one of the sentence length information, the sentence-title coincidence degree information, and the sentence location information; then encodes each sentence according to the preset sentence feature information; and at last, obtains the second encoded vector according to the encoding result of each sentence in the sentence set. According to the foregoing manner, the indication of the sample sentences can be enriched by using the vector form, to improve the learning capability of the training model, thereby improving the accuracy when the abstract file information is output. In addition, the operability and the feasibility of the solution can be improved, facilitating the actual operation.

Optionally, based on the embodiment corresponding to FIG. 5, in another embodiment of the information processing apparatus 20, the determining module 203 is specifically configured to concatenate the first encoded vector and the second encoded vector into the global information by using a connection function concat.

Further, in this embodiment, a manner of determining the global information according to the first encoded vector and the second encoded vector is described. To be specific, the global information can be obtained by concatenating the first encoded vector and the second encoded vector. According to the foregoing manner, global information that is more abundant and that includes more features can be obtained. Encoding using this global information helps to improve diversity and accuracy of training, thereby obtaining a more proper training model.

Optionally, based on the embodiment corresponding to FIG. 5, in another embodiment of the information processing apparatus 20, the second processing module 204 is specifically configured to: encode the global information by using the preset neural network algorithm; and obtain the global encoded vector according to an encoding result of the global information.

Further, in this embodiment, a manner of obtaining the global encoded vector corresponding to the to-be-processed text information is described. To be specific, the global information is first encoded by using the preset neural network algorithm, and then the global encoded vector is obtained according to the encoding result of the global information. According to the foregoing manner, the operability and the feasibility of the solution can be improved, facilitating the actual operation.

Optionally, based on the embodiment corresponding to FIG. 5, in another embodiment of the information processing apparatus 20, the decoding module 205 is specifically configured to: decode the global encoded vector by using the decoder, to obtain decoded information corresponding to each sentence;

normalize the global encoded vector, to obtain a normalized value; and determine, according to the normalized value and the decoded information corresponding to each sentence, the probability value corresponding to each sentence in the to-be-processed text information.

Further, in this embodiment, a manner of decoding the global encoded vector by using the decoder to obtain the probability value corresponding to each sentence in the to-be-processed text information is described. According to the foregoing manner, practicability and the operability of the solution can be improved.

Figure 6:
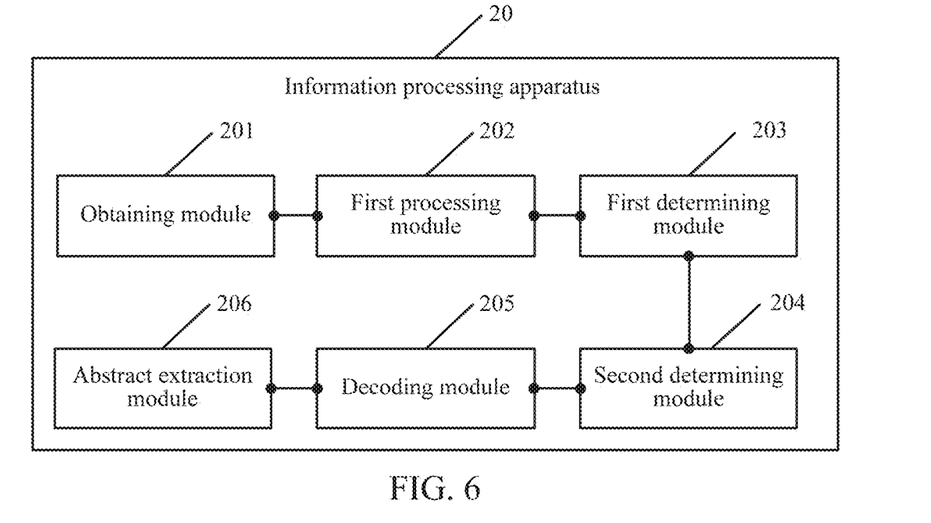
FIG. 6 is a schematic diagram of another embodiment of an information processing apparatus according to an embodiment.

Optionally, based on the embodiment corresponding to FIG. 5, in another embodiment of the information processing apparatus 20, the information processing apparatus 20 further includes:

an abstract extraction module 206, configured to: determine, after the decoding module 205 decodes the global information by using the decoder, to determine the probability value corresponding to each sentence in the to-be-processed text information, whether the probability value corresponding to each sentence is greater than a preset threshold;

if yes, use a sentence whose probability value is greater than the preset threshold as a target sentence; and determine the abstract file information according to the target sentence;

or:

sort the probability value corresponding to each sentence;

use top k sentences in a sorting result as target sentences; and determine the abstract file information according to the target sentences.

Further, in this embodiment, a manner of determining the abstract file information is described. To be specific, it is first determined whether the probability value corresponding to each sentence in the to-be-processed text information is greater than the preset threshold, then the sentences whose probability values are greater than the preset threshold is used as the target sentences, and at last, the target sentences are integrated into the required abstract file information. According to the foregoing manner, the target sentences may be determined according to the probability values. To be specific, the target sentence is a sentence whose occurrence probability is relatively high in the to-be-processed text information. Therefore, an integrated sentence set is closer to an actual case, thereby improving accuracy of abstract content.

Figure 7:
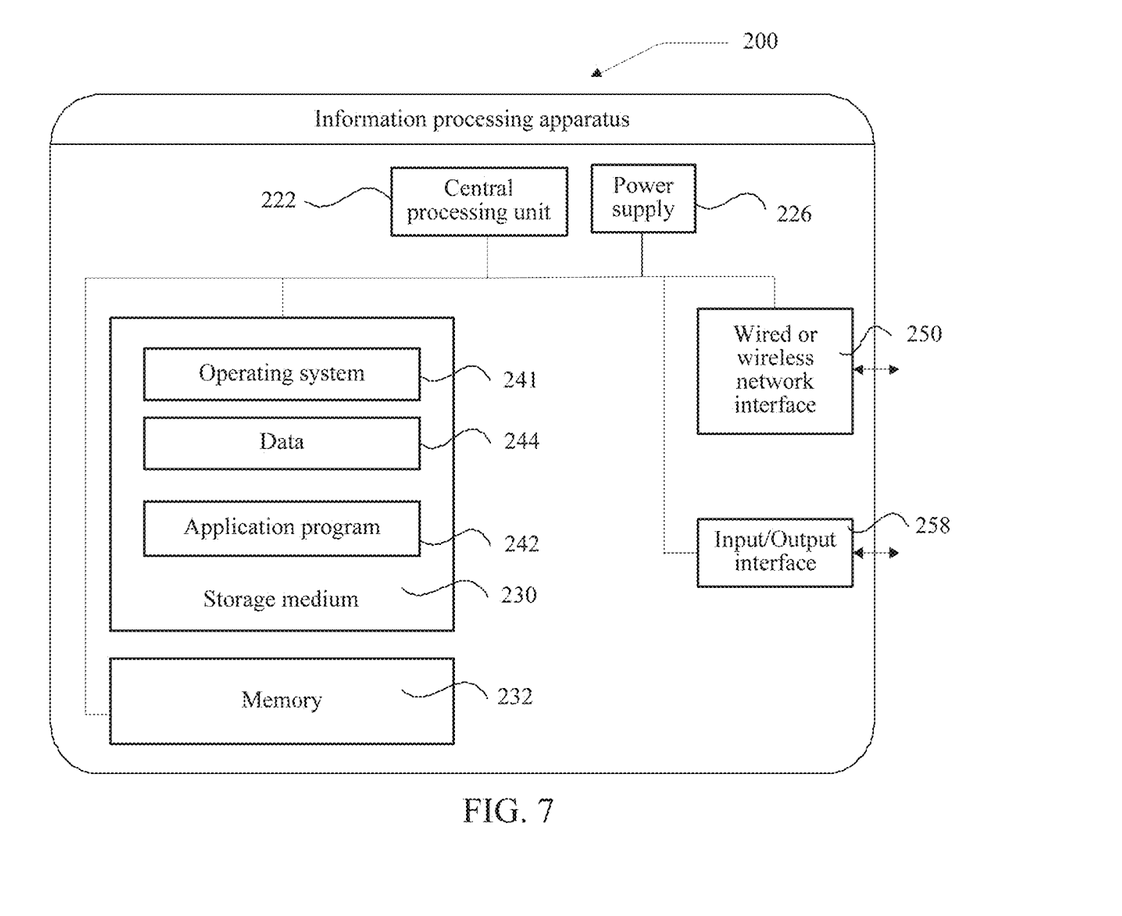
FIG. 7 is a schematic structural diagram of an information processing apparatus according to an embodiment.

FIG. 7 is a schematic structural diagram of an information processing apparatus according to various embodiments. The information processing apparatus 300 may vary greatly due to different configurations or performance, and may include one or more central processing units (CPUs) 322 (for example, one or more processors), a memory 332, and one or more storage media 330 (for example, one or more mass storage devices) that store application programs 342 or data 244. The memory 332 and the storage medium 330 may be transient or persistent storages. The program stored in the storage medium 330 may include one or more modules (not shown in the figure), and each module may include a series of instructions and operations for the information processing apparatus. Still further, the CPU 322 may be configured to communicate with the storage medium 330, and perform, on the information processing apparatus 300, the series of instructions and operations in the storage medium 330.

The information processing apparatus 300 may further include one or more power supplies 326, one or more wired or wireless network interfaces 350, one or more input/output interfaces 358, and/or one or more operating systems 341, for example, Windows Server™, Mac OS X™, Unix™, Linux™, or FreeBSD™.

Steps performed by the information processing apparatus in the foregoing embodiment may be based on the structure of the information processing apparatus shown in FIG. 7.

The CPU 322 may be configured to perform the following steps:

obtaining to-be-processed text information and a sentence set;

encoding a sentence in the sentence set by using a first encoder, to obtain a first encoded vector; and encoding the sentence in the sentence set by using a second encoder, to obtain a second encoded vector, the first encoded vector being determined according to the sentence, and the second encoded vector being determined according to a feature of the sentence;

determining a sentence encoded vector according to the first encoded vector and the second encoded vector;

encoding the sentence encoded vector by using a third encoder, to obtain global information; and decoding the global information by using a decoder, and obtaining, according to a decoding result, a probability value corresponding to each sentence in the to-be-processed text information, the probability value being used for determining abstract file information.

Optionally, the CPU 322 is configured to perform the following steps:

encoding each sentence in the sentence set by using a preset neural network algorithm; and obtaining the first encoded vector according to an encoding result of each sentence in the sentence set.

Optionally, the CPU 322 is configured to perform the following steps:

obtaining preset sentence feature information of each sentence in the sentence set, where the preset sentence feature information includes at least one of sentence length information, sentence-title coincidence degree information, and sentence location information;

encoding each sentence according to the preset sentence feature information; and obtaining the second encoded vector according to an encoding result of each sentence in the sentence set.

Optionally, the CPU 322 is configured to perform the following step:

concatenating the first encoded vector and the second encoded vector into the global information by using a connection function concat.

Optionally, the CPU 322 is configured to perform the following steps:

encoding the global information by using the preset neural network algorithm; and obtaining the global encoded vector according to an encoding result of the global information.

Optionally, the CPU 322 is configured to perform the following steps:

decoding the global encoded vector by using the decoder, to obtain decoded information corresponding to each sentence;

normalizing the global encoded vector, to obtain a normalized value; and determining, according to the normalized value and the decoded information corresponding to each sentence, the probability value corresponding to each sentence in the to-be-processed text information.

Optionally, the CPU 322 is further configured to perform the following steps:

determining whether the probability value corresponding to each sentence is greater than a preset threshold;

if a probability value corresponding to a sentence is greater than the preset threshold, using the sentence whose probability value is greater than the preset threshold as a target sentence; and determining the abstract file information according to the target sentence;

or:

sorting the probability value corresponding to each sentence;

using top k sentences in a sorting result as target sentences; and determining the abstract file information according to the target sentences.

All or some of the foregoing embodiments may be implemented by using software, hardware, firmware, or any combination thereof. When implemented by using software, some or all of the embodiments may be implemented in a form of a computer program product.

The computer program product includes one or more computer instructions. When the computer program instructions are loaded and executed on a computer, some or all of the procedures or functions described according to the embodiments of the present disclosure are generated. The computer may be a general-purpose computer, a special-purpose computer, a computer network, or other programmable apparatuses. The computer instructions may be stored in a computer-readable storage medium, or transmitted from one computer-readable storage medium to another computer-readable storage medium. For example, the computer instructions may be transmitted from one web site, computer, server, or data center to another web site, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, such as a server or a data center, including one or more usable media. The usable medium may be a magnetic medium (for example, a soft disk, a hard disk, or a magnetic tape), an optical medium (for example, a DVD), a semiconductor medium (for example, a solid state disk (Solid State Disk, SSD)), or the like.

Persons skilled in the art may clearly understand that, for the purpose of convenient and brief description, for a specific working process of the foregoing system, apparatus, and unit, refer to a corresponding process in the foregoing method embodiments, and details are not described herein again.

In the several embodiments provided in the present disclosure, it should be understood that the disclosed system, apparatus, and method may be implemented in other manners. For example, the described apparatus embodiment is merely an example. For example, the unit division is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments may be integrated into one processing unit, or each of the units may exist alone physically, or two or more units may be integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments. The storage medium includes any medium that can store program code, such as a USB flash drive, a removable hard disk, a read-only memory (ROM), a random access memory (RAM), a magnetic disk, or an optical disc.

The foregoing embodiments are merely intended to describe the technical solutions of the present disclosure, but not to limit the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof.

What is claimed is:

1. An information processing method, comprising:
   obtaining text information and a sentence set;
   encoding a sentence in the sentence set using a first encoder to obtain a first encoded vector, and encoding the sentence in the sentence set using a second encoder to obtain a second encoded vector, the first encoded vector being determined according to the sentence, and the second encoded vector being determined according to a feature of the sentence;
   determining a sentence encoded vector according to the first encoded vector and the second encoded vector;
   encoding the sentence encoded vector using a third encoder to obtain global information;
   decoding the global information using a decoder; and
   determining a probability value corresponding to each sentence in the text information, the probability value being used for determining abstract file information.

2. The method according to claim 1, wherein encoding the sentence in the sentence set using a first encoder to obtain the first encoded vector comprises:
   encoding each sentence in the sentence set using a preset neural network algorithm; and
   obtaining the first encoded vector according to an encoding result of each sentence in the sentence set.

3. The method according to claim 1, wherein encoding the sentence in the sentence set using the second encoder to obtain the second encoded vector comprises:
   obtaining preset sentence feature information of each sentence in the sentence set, wherein the preset sentence feature information comprises at least one of sentence length information, sentence-title coincidence degree information, or sentence location information;
   encoding each sentence in the sentence set according to the preset sentence feature information; and
   obtaining the second encoded vector according to a result of encoding each sentence in the sentence set.

4. The method according to claim 1, wherein encoding the sentence encoded vector using the third encoder to obtain the global information comprises:
   concatenating the first encoded vector and the second encoded vector into the global information using a connection function concat.

5. The method according to claim 1, further comprising:
   encoding the global information using the third encoder to obtain a global encoded vector.

6. The method according to claim 5, wherein encoding the global information using the third encoder to obtain the global encoded vector further comprising:
   encoding the global information using a preset neural network algorithm; and
   obtaining the global encoded vector according to an encoding result of the global information.

7. The method according to claim 5, further comprising:
   decoding the global encoded vector using the decoder to obtain decoded information corresponding to each sentence; and
   wherein determining the probability value corresponding to each sentence in the text information comprises:
      normalizing the global encoded vector, to obtain a normalized value; and
      determining, according to the normalized value and the decoded information corresponding to each sentence, the probability value corresponding to each sentence in the text information.

8. The method according to claim 7, wherein, after decoding the global encoded vector using the decoder, and determining the probability value corresponding to each sentence in the text information, the method further comprises:
   for each sentence, determining whether the probability value corresponding to each sentence is greater than a preset threshold;
   using each sentence whose probability value is greater than the preset threshold as a target sentence of a plurality of target sentences; and
   determining the abstract file information according to the plurality of target sentences.

9. The method according to claim 7, wherein, after decoding the global encoded vector using the decoder, and determining the probability value corresponding to each sentence in the text information, the method further comprises:
   using a top k sentences having highest probability values as target sentences, wherein k is an integer greater than 0; and
   determining the abstract file information according to the target sentences.

10. An information processing apparatus, comprising a memory, a processor, and a bus system,
    wherein the memory is configured to store a program; and
    wherein the processor is configured to execute the program stored in the memory to perform the following:
    obtaining text information and a sentence set;
    encoding a sentence in the sentence set using a first encoder to obtain a first encoded vector, and encoding the sentence in the sentence set using a second encoder to obtain a second encoded vector, the first encoded vector being determined according to the sentence, and the second encoded vector being determined according to a feature of the sentence;
    determining a sentence encoded vector according to the first encoded vector and the second encoded vector;
    encoding the sentence encoded vector using a third encoder to obtain global information;
    decoding the global information using a decoder; and
    determining a probability value corresponding to each sentence in the text information, the probability value being used for determining abstract file information; and
    the bus system being configured to connect the memory and the processor, so that the memory can communicate with the processor.

11. The information processing apparatus according to claim 10, wherein the processor is configured to execute the program stored in the memory to further perform the following:
  encoding each sentence in the sentence set using a preset neural network algorithm; and
  obtaining the first encoded vector according to an encoding result of each sentence in the sentence set.

12. The information processing apparatus according to claim 10, wherein the processor is configured to execute the program stored in the memory to further perform the following:
  obtaining preset sentence feature information of each sentence in the sentence set, wherein the preset sentence feature information comprises at least one of sentence length information, sentence-title coincidence degree information, or sentence location information;
  encoding each sentence in the sentence set according to the preset sentence feature information; and
  obtaining the second encoded vector according to a result of encoding each sentence in the sentence set.

13. The information processing apparatus according to claim 10, wherein the processor is configured to execute the program stored in the memory to further perform the following:
  concatenating the first encoded vector and the second encoded vector into the global information using a connection function concat.

14. The information processing apparatus according to claim 10, wherein the processor is configured to execute the program stored in the memory to further perform the following:
  encoding the global information using the third encoder to obtain a global encoded vector.

15. The information processing apparatus according to claim 14, wherein the processor is configured to execute the program stored in the memory to further perform the following:
  encoding the global information using a preset neural network algorithm; and
  obtaining the global encoded vector according to an encoding result of the global information.

16. The information processing apparatus according to claim 14, wherein the processor is configured to execute the program stored in the memory to further perform the following:
  decoding the global encoded vector using the decoder to obtain decoded information corresponding to each sentence;
  normalizing the global encoded vector, to obtain a normalized value; and
  determining, according to the normalized value and the decoded information corresponding to each sentence, the probability value corresponding to each sentence in the text information.

17. The information processing apparatus according to claim 16, wherein the processor is configured to execute the program stored in the memory to further perform the following:
  for each sentence, determining whether the probability value corresponding to each sentence is greater than a preset threshold;
  using each sentence whose probability value is greater than the preset threshold as a target sentence of a plurality of target sentences; and
  determining the abstract file information according to the plurality of target sentences.

18. The information processing apparatus according to claim 16, wherein the processor is configured to execute the program stored in the memory to further perform the following:
  using a top k sentences having highest probability values as target sentences, wherein k is an integer greater than 0; and
  determining the abstract file information according to the target sentences.

19. A non-transitory computer-readable storage medium comprising instructions, the instructions, when executed by a computer, causing the computer to perform the following:
  obtaining text information and a sentence set;
  encoding a sentence in the sentence set using a first encoder to obtain a first encoded vector, and encoding the sentence in the sentence set using a second encoder to obtain a second encoded vector, the first encoded vector being determined according to the sentence, and the second encoded vector being determined according to a feature of the sentence;
  determining a sentence encoded vector according to the first encoded vector and the second encoded vector;
  encoding the sentence encoded vector using a third encoder to obtain global information;
  decoding the global information using a decoder; and
  determining a probability value corresponding to each sentence in the text information, the probability value being used for determining abstract file information.

20. The non-transitory computer-readable storage medium of claim 19, wherein the instructions, when executed by the computer, cause the computer to further perform the following:
  obtaining preset sentence feature information of each sentence in the sentence set, wherein the preset sentence feature information comprises at least one of sentence length information, sentence-title coincidence degree information, or sentence location information;
  encoding each sentence in the sentence set according to the preset sentence feature information; and
  obtaining the second encoded vector according to a result of encoding each sentence in the sentence set.

* * * * *